United States Patent [19]

Hedrick et al.

[11] Patent Number: 5,700,844
[45] Date of Patent: Dec. 23, 1997

[54] PROCESS FOR MAKING A FOAMED POLYMER

[75] Inventors: Jeffrey Curtis Hedrick, Park Ridge, N.J.; James Lupton Hedrick, Pleasanton, Calif.; Yun-Hsin Liao, W. Nyack, N.Y.; Robert Dennis Miller, San Jose, Calif.; Da-Yuan Shih, Poughkeepsie, N.Y.

[73] Assignee: International Business Machines Corporation, Armonk, N.Y.

[21] Appl. No.: 629,254

[22] Filed: Apr. 9, 1996

[51] Int. Cl.$^6$ ........................................ C08J 9/02
[52] U.S. Cl. ........................ 521/77; 521/134; 521/139; 521/154
[58] Field of Search ..................... 521/77, 134, 139, 521/154

[56] References Cited

U.S. PATENT DOCUMENTS

| | | | |
|---|---|---|---|
| 2,915,483 | 12/1959 | Barnhart | 260/2.5 |
| 3,054,761 | 9/1962 | Moore et al. | 260/2.5 |
| 3,213,043 | 10/1965 | Kehr | 260/2.5 |
| 3,224,983 | 12/1965 | D'Alelio | 260/2.5 |
| 3,547,839 | 12/1970 | Tocker | 260/2.5 |
| 3,917,761 | 11/1975 | Scheuerlein et al. | 264/41 |
| 4,418,157 | 11/1983 | Modic | 521/82 |
| 4,490,733 | 12/1984 | Kuphal et al. | 521/485 |
| 4,623,463 | 11/1986 | Ford et al. | 210/500.29 |
| 4,761,233 | 8/1988 | Linder et al. | 210/500.37 |
| 4,851,452 | 7/1989 | Gross et al. | 521/134 |
| 5,130,025 | 7/1992 | Lefebmre et al. | 210/638 |
| 5,183,607 | 2/1993 | Beall et al. | 264/41 |
| 5,188,777 | 2/1993 | Joesten et al. | 264/41 |
| 5,441,690 | 8/1995 | Ayala-Esquilin et al. | 264/277 |

FOREIGN PATENT DOCUMENTS

| | | | |
|---|---|---|---|
| WO87/01710 | 3/1987 | European Pat. Off. | C08J 9/04 |
| 0593966A1 | 10/1993 | European Pat. Off. | H01L 23/538 |
| 63-172741 | 7/1988 | Japan . | |
| 63-278943 | 11/1988 | Japan . | |
| 5-205526 | 8/1993 | Japan . | |
| 2006643A | 10/1978 | United Kingdom | B01D 13/04 |

Primary Examiner—Morton Foelak
Attorney, Agent, or Firm—Robert B. Martin

[57] ABSTRACT

The invention relates to a process for making a foamed polymer. The process involves (a) dispersing thermally degradable solid particles in polymer precursor; (b) crosslinking the polymer precursor to form a rigid, crosslinked polymer without degrading the particles; and (c) heating the polymer to degrade the particles and form the polymer foam.

4 Claims, No Drawings

PROCESS FOR MAKING A FOAMED POLYMER

FIELD OF THE INVENTION

The present invention relates to a process for making a foamed elastomeric polymer for use as a dielectric in electronic components.

BACKGROUND OF THE INVENTION

There is a continuing desire in the electronics industry to increase the circuit density in electronic components, e.g., circuit boards, multichip module chip test devices, and the like without degrading electrical performance (e.g., crosstalk) and also to increase the speed of signal propagation in these components. One method of accomplishing these goals is to reduce the dielectric constant of the polymeric insulator used in the components. A method for reducing the dielectric constant of a polymeric insulator is to foam the polymer with very small, uniformly dispersed air-filled pores.

Polymeric foams are well known in the art. One prior art process of making polymeric foams involves dispersing thermally decomposable particles in the monomer reaction mixture. The mixture is then heated to cause simultaneous (i) polymerization and (ii) thermal decomposition of the particles to form a gas. The gas expands in the reacting monomer mixture to form large pores in the final polymer product. Unfortunately, the process results in large and nonuniform pore sizes throughout the polymer bulk.

It is therefore an object of the present invention to provide an improved process for making a foamed polymer suitable for use in electronic devices.

Other objects and advantages will become apparent from the following disclosure.

SUMMARY OF THE INVENTION

The present invention relates to a process for forming a foamed polymer. The process involves (a) dispersing thermally degradable solid particles in polymer precursor; (b) polymerizing the polymer precursor to form a rigid, solid polymer without degrading the particles; and (c) heating the polymer to degrade the particles and form the polymer foam without expansion of the polymer. The size of the pores formed in the polymer product are substantially the same size (dimension) as the size of the degraded particles used in the reaction mixture. Preferably, the process relates to forming foamed elastomeric polymers such as polysiloxane. The foamed polymer made by the process of the invention has uniformly dispersed pores with uniform pore sizes preferably from about 1 to 10 microns.

A more thorough disclosure of the present invention is presented in the detailed description.

DETAILED DESCRIPTION OF THE INVENTION

The present invention relates to a process for forming a foamed polymer. Preferably, the process involves three steps. The first step involves dispersing thermally degradable particles, preferably polymer particles, in the polymer precursor. The particles can be dispersed in the polymer precursor by art known methods such as three roll mill or planetary mixers. Suitable polymer precursors include monomers and oligomers. A variety of foamed polymers can be made by the process of the present invention.

A preferred polymer formed by the process is polysiloxane (e.g., polydimethyl-co-diphenyl siloxane) such as disclosed in U.S. Pat. No. 5,441,690, the disclosure of which is incorporated herein by reference for all purposes. Suitable precursors for polysiloxane are siloxane monomers or oligomers with reactive end groups such as vinyl, hydroxy, alkynyl or acetoxy end groups.

Suitable thermally degradable particles are polymeric particles such as polymethylmethacrylate (PMMA), polystyrene and poly($\alpha$-methyl-styrene). The particles suitably have a size of about ½ to 20 microns, preferably about 1 to 10 microns. Suitable PMMA particles can be prepared by cobalt mediated dispersion polymerization of methyl methacrylate in hexane with siloxane surfactant.

Additives may also be dispersed in the polymerization reaction mixture such as fillers (e.g., inorganic fillers such as zinc oxide) or the like.

The second step of the process of the present invention involves polymerizing the precursors. Preferably, the precursors are crosslinked. Preferred precursors for polysiloxane are vinyl terminated siloxane oligomers. For polysiloxane foams, polymerization is suitably initiated by hydrosilation with a platinum catalyst at a temperature of about 60° to 200° C. which is below the thermal degradation temperature of the thermally degradable particles. Polymerization results in the formation of a rigid, crosslinked, solid polysiloxane with the thermally degradable particles uniformly dispersed throughout the polymer bulk.

The third step of the process of the present invention involves heating the crosslinked polymer to an elevated temperature to degrade the thermally degradable particles which are dispersed in the polymer bulk without degradation of the polymer. The crosslinked polymer can be heated by thermal (oven) heating or microwave heating. The heating cause degradation of the solid particles to form a gas which diffuses out of the polymer bulk without expansion of the polymer and allows the pores to fill up with air.

The foamed polymer formed by the process of the present invention has uniformly distributed pores throughout the bulk of the polymer on the order of 1–20 micron. Further, the pore size can be adjusted (from submicron to 30 microns and above) by varying the size of the thermally degradable particles. The polymer has low stress, low dielectric constant, improved toughness and improved compliance during mechanical contacting to require less contact force during compression. The polymer made by the process of the present invention is suitable for use in electronic devices including an integrated circuit chip test probe and pinless connector for packaging.

The following examples are a detailed description of the process of invention. The detailed description falls within the scope of, and serves to exemplify, the more generally described process set forth above. The examples are presented for illustrative purposes only, and are not intended as a restriction on the scope of the invention.

EXAMPLE 1

Preparation of Thermally Degradably PMMA Particles

Poly(methyl methacrylate) particles were formed via a dispersion polymerization method. In this synthetic approach, the starting materials, monomers, surfactant, etc., are miscible in the solvent. However, the solvent is a nonsolvent for the polymer and, upon formation the small polymer particles precipitate out of the solvent. Methyl methacrylate (20 g); 5, 10, 15, 20-tetraphenyl-21H, 23H-porphine cobalt (II); AIBN (radical initiator (0.2 g), and hexane (300 mL) were charged into a flask. The reaction was heated to 65° C. under rapid stirring. The resulting powder was isolated by filtration and had a particle size of about 3 microns and a molecular weight of ~73,000 g/mol.

EXAMPLE 2

Preparation of Polysiloxane Foam

The PMMA powder (1 g) from example 1 was mixed in with polydimethyl siloxane fluid (Sylgard 18L) with curing agent (9 g) and cured 65° C. for 4 h, followed by a post cure of 150° for 2 h. The decomposition of the PMMA was accomplished by a post cure of 300° C. for (2 h) without expansion of the polymer. The foam polymer had pore sizes of about 3 microns.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of the invention.

We claim:

1. A process for making a polysiloxane foam comprising the steps of:
    (a) dispersing thermally degradable polymer particles in polysiloxane precursor;
    (b) polymerizing the polysiloxane precursor to form rigid polysiloxane without degrading the particles; and
    (c) heating the polysiloxane to degrade the particles without expanding the polysiloxane and form the polysiloxane foam.

2. The process of claim 1 wherein step (b) the polysiloxane is crosslinked.

3. The process of claim 1 wherein the particles are comprised of polymethylmethacrylate.

4. The process of claim 3 wherein the polysiloxane foam has a pore size of about 1 to 10 microns.

* * * * *